United States Patent [19]

Bhalla

[11] Patent Number: 5,894,141
[45] Date of Patent: Apr. 13, 1999

[54] BIPOLAR SEMICONDUCTOR POWER CONTROLLING DEVICES WITH HETEROJUNCTION

[75] Inventor: Anup Bhalla, Wilkes-Barre, Pa.

[73] Assignee: Harris Corporation, Melbourne, Fla.

[21] Appl. No.: 08/885,227

[22] Filed: Jun. 30, 1997

[51] Int. Cl.$^6$ .................... H01L 29/165; H01L 29/745; H01L 29/737
[52] U.S. Cl. .................... 257/197; 257/139; 257/152; 257/155; 257/163
[58] Field of Search .................... 257/152, 155, 257/163, 144, 139, 197

[56] References Cited

U.S. PATENT DOCUMENTS

| | | | |
|---|---|---|---|
| 3,275,906 | 9/1966 | Matsukura | 257/197 |
| 5,142,641 | 8/1992 | Fujioka | 257/361 |
| 5,204,871 | 4/1993 | Larkins | 257/13 |

*Primary Examiner*—Jerome Jackson, Jr.
*Attorney, Agent, or Firm*—Henry I Schanzer, Esq

[57] ABSTRACT

Semiconductor bipolar power devices comprise a control electrode for turning on or off a first source of charge carriers into the device and a p-n junction emitter remote from the first source and acting in correspondence with the condition of the first source. The p-n junction is a heterojunction where the bandgap of the semiconductor material of the emitter side of the junction is less wide than the bandgap of the material on the base side for reducing the emitter injection efficiency in comparison with an otherwise identical device having a homojunction emitter.

12 Claims, 2 Drawing Sheets

1

BIPOLAR SEMICONDUCTOR POWER CONTROLLING DEVICES WITH HETEROJUNCTION

BACKGROUND OF THE INVENTION

This invention relates to semiconductor devices in general, and particularly to bipolar semiconductor devices of the type used for controlling the flow of electrical power.

In the design of bipolar semiconductor power devices, there is generally a trade-off between low on-state voltage drop across the device and fast switching time, particularly fast turn-off of the device. Low voltage drop is achieved by bipolar operation, i.e., the introduction of both p and n type charge carriers through the device for obtaining large charge carrier densities. Large densities cause the device to operate in a "conductivity modulated" mode providing a low resistance to current flow. Conversely, because switching off the device requires removal of charge carriers from within the device, large current densities tend to increase device turn-off time.

The trade-off generally accepted is the use of bipolar operation for high charge carrier density, but operation at a level of charge density somewhat reduced from the maximum density otherwise available. Typically, for example, two "areas" of origination of charge carriers are present in each device, a first of which is under the "direct" control of a nearby control electrode, and the second of which is spaced from the first "area" and which operates in response to the turn-on and turn-off of the first area. (As described hereinafter, the term "area of origination" is intended to cover both "source regions" in field-effect devices and "emitter regions" in high-low and p-n junction devices.)

In all devices in which the present invention has utility, the second "area" is a p-n junction across which charges are injected by an "emitter". Typical techniques for reducing the amount of charge injected across a p-n junction include reducing the effective size of the junction, e.g., by providing charge carrier paths ("shorts") bypassing the p-n junction, and/or selective doping of the emitter region and/or the adjoining region forming the p-n junction with the emitter region. The shorted emitter construction tends to be complex and relatively expensive and the selective doping, depending upon the doping scheme used, can also add complexity and cost to the device or be otherwise undesirable in terms of device performance or manufacture.

Another technique for improving device turn-off speed is to reduce the life-time of the charge carriers within the device, e.g., by the introduction of carrier recombination sites. However, this is undesirable for, among other things, adding extra processing and cost to the devices.

The present invention is directed to a different mechanism for obtaining reduced injection efficiency of the second "area of origination" of charge carriers within the devices, that is, the p-n junction emitter region remote from the gate controlled first "area" of the devices, which different mechanism provides certain advantages in device performance and device manufacture. The "different mechanism" hereinafter described can, depending upon the particular semiconductor device being made, be used in combination with known mechanisms, e.g., lifetime control mechanisms.

SUMMARY OF THE INVENTION

A semiconductor bipolar device comprises a first body of a first semiconductor material, preferably silicon, having a first bandgap. The body includes a first "area of origination" of charge carriers of a first conductivity type and a gate control electrode disposed proximate to the first "area". The charge carriers from the first "area" enter a first region of the first body forming a heterojunction with a second body of a second semiconductor material, preferably silicon-germanium, having a second bandgap less than the first bandgap. The second body comprises an emitter region (the second "area") for injecting charge carriers of the second conductivity type into the first body.

In comparison with prior art devices having emitter regions of the first semiconductor material and forming homojunctions with the first body, the heterojunction emitters of the inventive devices have inherently lower injection efficiencies, hence can be designed with characteristics, e.g., doping levels, more advantageous to the semiconductor devices.

DESCRIPTION OF PREFERRED EMBODIMENTS

The present invention has utility in a relatively wide variety of semiconductor devices used for electrical power control functions, such devices including, but not limited to, insulated gate bipolar transistors (IGBTs), metal-oxide semiconductor gated thyristors (MOSTs) and gate turn-off thyristors (GTOs). Herein, only three different semiconductor devices making use of the inventive concept are described; how the invention can be used in other semiconductor devices of the bipolar type will be apparent based upon the following description.

Figure 1:
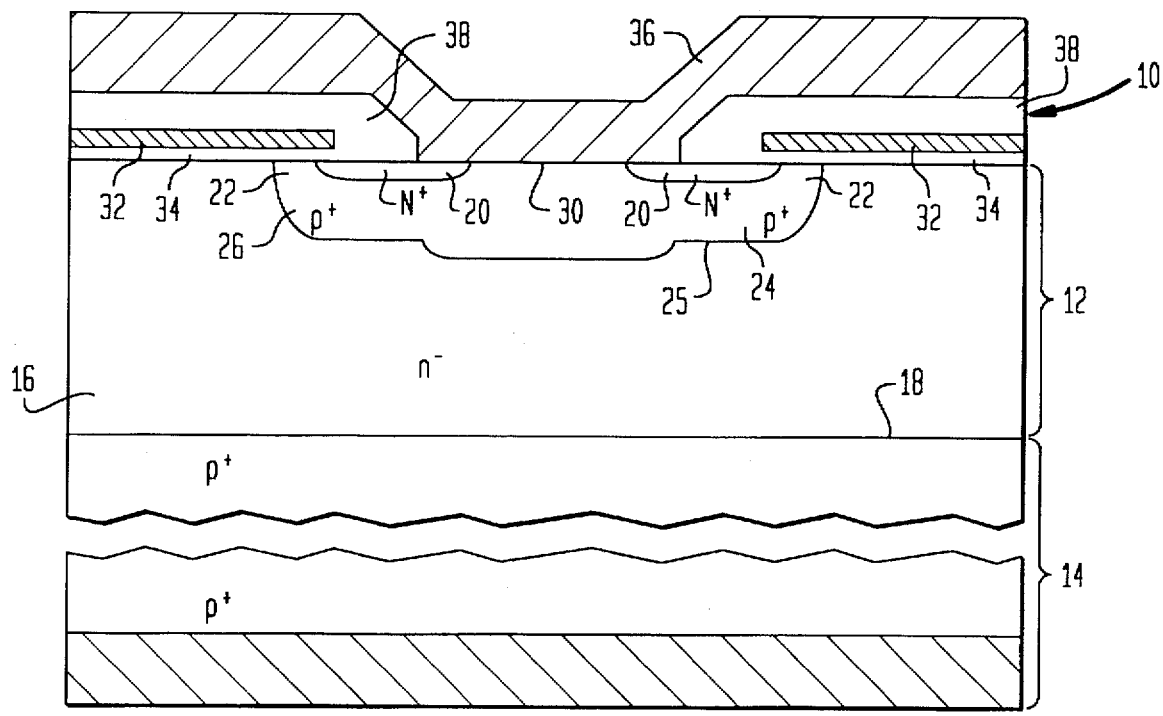
FIGS. 1, 3 and 4 are schematic, sectional views of, respectively, an IGBT, a buffered IGBT, and a GTO made in accordance with this invention.

FIG. 1 shows an IGBT 10 in accordance with the invention. Although the device 10 differs from prior art IGBTs, as shortly to be described, the basic structure of the inventive device 10, as shown schematically in FIG. 1, can be substantially identical to known IGBTs. Because of this, no attempt is made to accurately illustrate the inventive device which preferably comprises, similarly as prior art IGBTs, a relatively large number of structures similar to the one shown in FIG. 1 connected in parallel within a single semiconductor substrate.

The device 10 does differ from known IGBTs, however, in that it comprises two integrally connected bodies 12 and 14 of different semiconductor materials. In terms of the intended effect to be obtained by the use of the different semiconductor materials, the only requirement is that the materials have different bandgaps, with the wider bandgap material forming the upper portion 12 of the device 10 as shown in FIG. 1. (This is discussed further hereinafter.) While the invention is not limited to any particular two semiconductor materials, based upon the vast experience with the use and manufacture of silicon in comparison with other semiconductor materials, the preferred "two" materials are silicon and a material basically of silicon, e.g., a silicon-germanium alloy. In FIG. 1, the upper portion 12 of the device comprises monocrystalline silicon and the lower portion 14 comprises a monocrystalline alloy of silicon and germanium identifiable as $Si_{1-x}Ge_x$. The preferred values of X are described hereinafter but, in general, X is only a few percent.

The device 10 can be made using known technology including epitaxially growing a monocrystalline layer of silicon onto a monocrystalline substrate of $Si_{1-x}Ge_x$ (Si—Ge), or by bonding a silicon wafer to a Si—Ge wafer.

In this embodiment, the Si—Ge body 14 is doped to be of p type conductivity while the silicon region 16 directly in contact with the Si—Ge body is of n type conductivity. The junction 18 between the two contacting materials (known as a "heterojunction" because of the different bandgap materials forming it) is thus a p-n junction across which charge carriers are injected when the p-n junction 18 is suitably forward biased.

As mentioned, the device 10 shown in FIG. 1 is an IGBT and, even with the difference from the prior art of the presence of a heterojunction 18 rather than a conventional homojunction, the device 10 is structurally and functionally identical to known IGBTs but with certain advantages hereinafter described.

Disposed within the silicon body 12 of the device 10 are an $n^+$ source region 20, $p^-$ channel region 22 and the aforementioned region 16 comprising an $n^-$ drain region. The channel region 22 is a portion of a composite body region 25 having a $p^+$ portion 26 generally underlying the $n^+$ source region 20 and a $p^-$ portion (the channel region 22) extending upwardly past the source region 20 to the surface 30 of the body 12.

Overlying the surface 30 of the body 12 is a gate electrode 32 dielectrically isolated from the surface 30 by a layer 34 of silicon dioxide. The gate electrode 32 completely overlies the channel region 22 and, in known fashion, controls the conductivity of the channel region in response to voltages applied to the gate electrode.

A source electrode 36 making contact to both the source region 20 and the $p^+$ portion 26 is also shown, the source electrode 36, in this embodiment, overlying the gate electrode 32 and being insulated therefrom by an insulating layer 38 of silicon dioxide.

The bottom portion of the drain region 16, which also forms the bottom portion of the silicon body 12, forms the aforementioned p-n junction 18 with the silicon germanium body 14.

The entire structure of the device 10 above the p-n junction 18 can be identical to a comparable structure of a known IGBT.

The fact that the body 14 is of a semiconductor material having a bandgap more narrow than the bandgap of the overlying silicon body 12 provides an important effect relative to the present invention, namely that, with all other "conditions" being the same, the quantity of charge carriers (holes in this embodiment) injected by the emitter 14 into the n drain region 16 is less than the amount that would be injected if the emitter 14 were of monocrystalline silicon.

By "conditions" is meant the same structure, the same dopings and the same bias conditions.

The physics of charge carrier injection across p-n junctions are known. In general, the injection efficiency of charge carriers across a p-n junction formed by different materials is an exponential function of the difference in bandgaps between the two materials.

The use of heterojunctions in certain types of semiconductor devices different from the power devices herein discussed is known. In certain heterojunction bipolar transistors, for example, a silicon emitter region forms a p-n junction with a silicon-germanium base region. The effect of such combination, in comparison with a silicon to silicon p-n junction (all other conditions being equal), is to reduce the back injection of minority carriers from the base into the emitter. For the example of an NPN transistor, the reduction factor is given by $\exp(\Delta Eg/kT)$ where $\Delta Eg$ is the difference in the bandgaps between silicon and the silicon-germanium material used. In such transistors, the object is to obtain a high emitter injection efficiency for high gain transistor operation.

In the present invention, the purpose is not to obtain high emitter efficiency, but rather, low emitter efficiency. Such reduction in emitter efficiency, in comparison with a silicon homojunction, is obtained by using the silicon-germanium material as the emitter region of the IGBT device.

Figure 2:
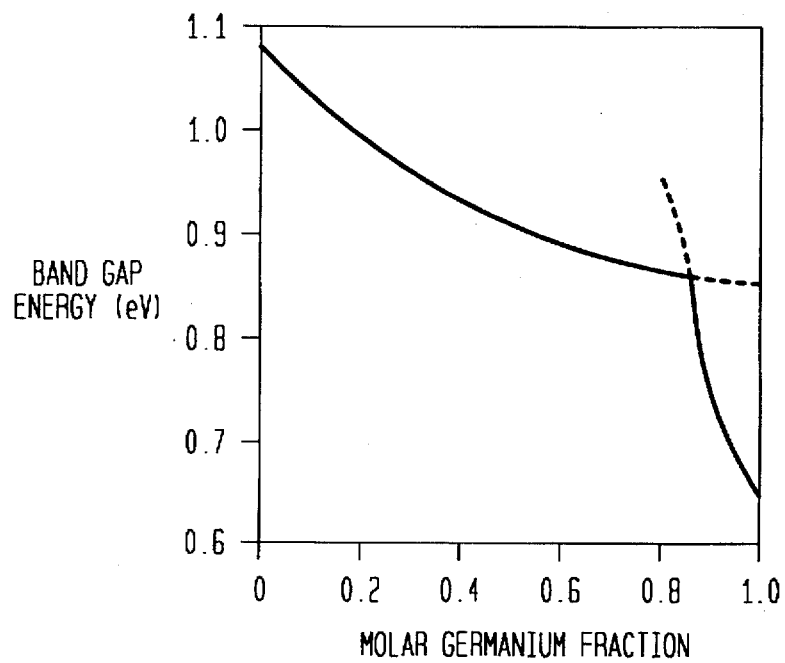
FIG. 2 is a graph showing bandgap energy of a silicon-germanium alloy as a function of the germanium content of the alloy.

The bandgap of the $Si_{1-x}Ge_x$ alloy is a function of its composition. This is shown in FIG. 2, where the ordinate is bandgap, in electron volts, and the abscissa is the molar germanium fraction. As further discussed hereinafter, a preferred range of germanium in the $Si_{1-x}Ge_x$ alloys used in the inventive devices is around 3–4% by weight, with the actual composition being primarily determined by the desired bandgap difference. This, in turn, is dependent upon the particular device being made and the characteristics thereof desired by the device designer.

With the heterojunction 18 present within the device 10, the operation thereof can be identical to known all-silicon devices. Thus, with a positive voltage applied to the emitter region 14 (via a metal electrode 42) and the source electrode 36 at ground potential, by applying a positive voltage (in this embodiment) to the gate electrode 32, a conductive channel is induced in the channel region 22 and electrons flow from the source region 20 through the channel region 22 to the drain region 16. The electrons drift downwardly towards the p-n junction 18 and the presence of such electrons forward biases the p-n junction to cause injection of holes from the emitter region 14 across the p-n junction 18 into the drain region 16. The device is thus turned on with the electrons being collected at the bottom electrode 42 and the holes being collected by the source electrode 36.

For turning the device off, the channel region 22 is pinched off by an appropriate gate voltage for preventing flow of electrons therethrough and, in the absence of the electrons flowing into the drain region 16 at the p-n junction 18, injection of holes by the emitter region 14 also ceases. However, the device is not fully turned off until all the charge carriers present within the device, and particularly in the large volume drain region 16, are removed. As known, and as previously mentioned, the time required to accomplish such removal is a direct function of the number of charge carriers being injected during the on-state from the emitter region 14. The number of charge carriers within the drain region also influences the on-state voltage drop across the device and, in practice, a trade-off is established between an on-state rate of charge injection from the emitter 14 sufficiently large to provide low on-state voltage drop but sufficiently small for adequately fast turn-off.

For purposes of comparison, it is assumed that the aforementioned trade-off used in a known all-silicon IGBT is the same trade-off used in the inventive IGBT 10. Thus, to obtain the same amount of charge injection from the low injection efficiency emitter 14 (forming a heterojunction 18 with the silicon drain region 16), some other adjustment must be made, as now discussed.

Another known factor in the injection efficiency from an emitter is its doping relative to its adjoining region. In the device 10, with all other factors being the same as in the comparative all-silicon IGBT, the injection efficiency of the emitter region 14 is increased to that of the comparable all-silicon device by using a higher emitter region doping in the device 10 in comparison with a standard emitter region in the comparable all-silicon device. This provides a definite advantage.

The higher doping of the emitter region 14 means that, for emitter regions of identical thickness, the silicon-germanium emitter region 14 can be of lower resistance than the comparable silicon emitter region. Thus, even with devices of identical switching speed and identical voltage drops through the upper portions of the devices, the inventive devices can have lower overall on-state voltage owing to the lower voltage drop through the higher conductivity emitter region.

Conversely, the emitter region 14 of higher conductivity can be made thicker than the comparable silicon emitter with identical total resistance. The thicker emitter region 14 is desirable owing to its greater strength and ease of handling. This reduces production losses owing to breakage of the semiconductor workpieces.

Figure 3:
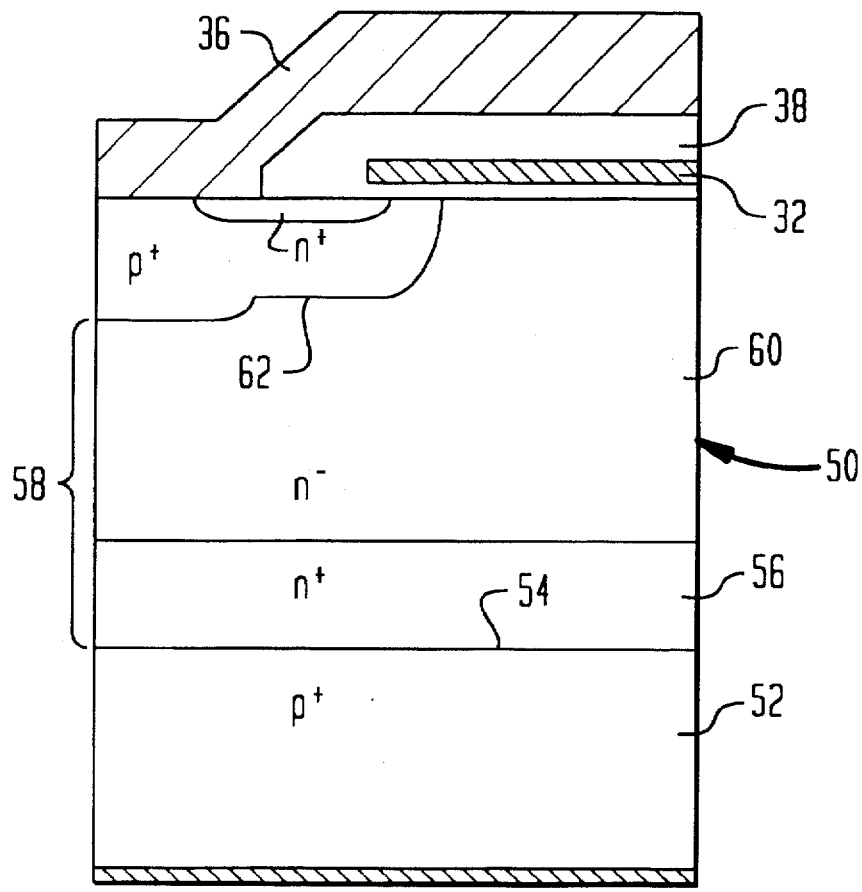

FIG. 3 shows another example of an IGBT 50 made using the present invention. As with the device 10, the inventive device 50 can be structurally identical to a known IGBT except that the bottom emitter region 52 is of a silicon-germanium alloy forming a p-n heterojunction 54 with an adjoining region 56 of the device.

Comparing the devices 50 (FIG. 3) and 10 (FIG. 1), it is seen that the device 50 includes an extra region 56. Such region 56 is known as a buffer region and is part of the device drain region 58 but of higher conductivity than a portion 60 of the drain region overlying the buffer region 56. For example, with an n– drain region portion 60, the buffer region 56 is of n conductivity. As known, the purpose of the n buffer region 56 is to prevent punch-through of the depletion region extending from the reversed biased p-n junction 62 when the device 50 is in its voltage blocking, off state.

An advantage of the device 50, in comparison with an otherwise structurally identical all-silicon device relates to the fact that, in the latter device, the buffer region typically serves two functions; one being to prevent the afore-described depletion region punch-through, and the other, in combination with a high conductivity (e.g., p$^+$) emitter region, being to reduce the injection efficiency of the p$^+$ emitter. The latter function requires that the buffer region be of higher conductivity than that required solely for obtaining punch-through protection. A problem is that providing a buffer region of high conductivity is somewhat difficult (in connection with known epitaxial growth procedures) and, in some instances, can adversely affect desired device characteristics.

Conversely, in the inventive device 50, owing to the reduction in emitter injection efficiency obtained inherently by the use of the heterojunction 54, the above-mentioned "latter" function of the buffer region (reduction of emitter efficiency in all-silicon devices) is not required. Accordingly, the buffer region 56 in the inventive device 50 can be of lower conductivity than the corresponding all-silicon device buffer region. The device 50 is thus somewhat easier to manufacture and can have improved operating characteristics.

Figure 4:
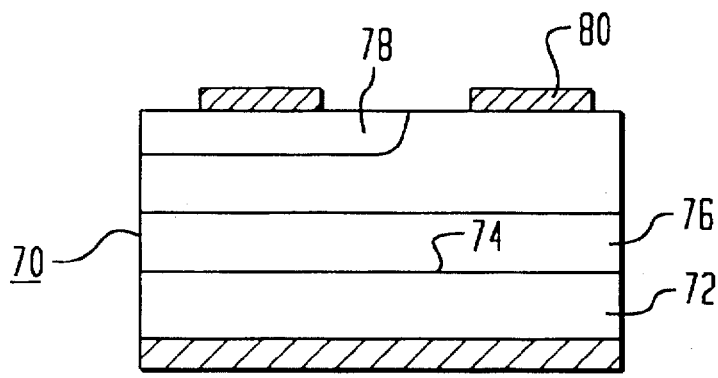

Another example of a device 70 using the present invention is shown in FIG. 4. The device 70 is a gate turn-off thyristor of known construction except that the lowermost region 72 (the device anode) forms a heterojunction 74 with the anode base region 76. (In contrast to insulated gate devices having a source region and a single p-n junction emitter region, a thyristor has two emitter regions referred to as anode and cathode regions.) In a thyristor, in contrast to a transistor, latch-up is to occur which requires that the sum of the common base current gains of the two charge carrier emitters (the anode 72 and the cathode 78) exceed a value of 1.0. Generally, this requires that the emitter efficiency at the junction 74 remote from the gate control electrode 80 not be too small. Still, by use of a heterojunction 74 in accordance with the invention, the anode region 72 can safely be of quite high conductivity for providing a low resistance current path through the anode region 72 for low on-state voltage drop.

While, as mentioned, the use of heterojunction is known, e.g., in bipolar transistors used for small signal, high speed amplification, heterojunctions have long been thought of as necessarily being avoided in voltage blocking, power handling devices. This is because experience has shown that, in the fabrication of such heterojunctions, structural or lattice defects are often present at the interface between the narrow and wide bandgap materials. Such defects are known to serve as trapping sites, tending to reduce the lifetime of charge carriers in the vicinity of the materials interface. Also, the regions containing the defects are less able to block voltages applied across the regions, i.e., the regions are more likely to experience larger leakage currents under reverse bias.

However, such shortcomings of heterojunction structures can actually be of advantage when used as herein discussed. Thus, as described, reduction in emitter injection efficiency is a specific goal of the heterojunction used as herein described and, provided the quality of the crystal structure at the heterojunction is not excessively bad (as to effectively block all semiconductor activity), the lifetime reduction caused by the lattice defects adds to the desired injection efficiency reduction.

Additionally, while the devices illustrated generally require a relatively high voltage blocking capability, such capability is provided by the reverse biasing of the homojunction of the devices, and little voltage blocking capability is required of the heterojunctions. For example, in the device 10, shown in FIG. 1, with the source electrode 36 grounded, a positive voltage applied to the bottom emitter region 14, and the channel region 22 in its non-conductive mode, the heterojunction 18 is forward biased, hence at a quite small voltage thereacross. Conversely, the homojunction 25 is reverse biased and withstands the entire voltage applied across the main terminals of the device 10. Accordingly, lattice defects often present at the heterojunction 18 do not adversely affect the voltage breakdown characteristics of the device.

The extent of the lattice mismatch and attendant lattice defects is a direct function of the difference in composition of the two materials at the homojunction, with the difference in composition being a function of the required difference in the bandgaps of the two materials. However, in devices of the type herein described making use of the present invention, the difference in bandgap between the two semiconductor materials can be quite small while still obtaining desirable results. For example, with an all-silicon device having an emitter injection efficiency of 1.0, quite desirable results are obtained by a reduction of emitter injection efficiency to around 0.25–0.30. Because injection efficiency is an exponential function of bandgap, such efficiency reduction requires a bandgap difference at the heterojunction of only from 0.031 eV to 0.035 eV, i.e., an actual bandgap of from 1.089 eV to 1.093 eV based upon the known silicon bandgap of 1.124 eV. As previously noted, such actual bandgap can be obtained in the SiGe alloy where the range of germanium content is around 3–4% by weight of the total alloy. Accordingly, the two semiconductor materials forming the heterojunctions are quite similar in composition, hence the number of lattice defects can be quite small with the defects being confined to but a few microns adjoining the materials interface. As previously indicated, the actual bandgap difference, as well as the semiconductor material compositions selected, is a function of the actual devices being made. Experiments necessary to arrive at the final device designs are well within the ability of persons of skill in the semiconductor arts.

Thus, notwithstanding the anticipated lattice mismatch and lattice defects resulting from the use of a heterojunction normally considered as being unacceptable in high voltage, power handling devices, quite adequately high quality heterojunctions can be made with the defects present actually contributing to the desired results.

A further consideration previously discouraging use of heterojunctions in devices of the type herein described is that the temperature dependence of the injection efficiency is increased exponentially as a function of bandgap difference. Thus, for example, if the injection efficiency of the heterojunction is 0.3 at room temperature (corresponding to a bandgap difference of 0.031 eV, as previously described), the injection efficiency becomes 0.42 at 150° C. leading to an increase in stored charge and a consequent decrease in switching speed. It happens, however, that IGBTs of the non-buffered type (such as shown in FIG. 1 in contrast to the device shown in FIG. 3) have a large positive temperature coefficient in their on states which causes high conduction losses at operating temperatures. This is countered, however, by the higher temperature dependence of the heterojunction, thus allowing the operation of non-buffered (non-punch-through) devices at higher current densities.

What is claimed is:

1. A bipolar semiconductor power controlling device comprising a first body of a first semiconductor material including a control electrode for controlling the flow of charge carriers of a first conductivity type into said first body across a p-n homojunction within said body, said first body forming a p-n heterojunction with a second body of a second semiconductor material having a bandgap more narrow than that of said first body, and a second electrode connected to said second body for causing said second body, during on-state operation of said device, to inject charge carriers of a second conductivity type across said p-n heterojunction and into said first body, said second body comprising a rigid substrate on which said first body is physically supported.

2. A device according to claim 1 wherein said first semiconductor material is silicon and said second semiconductor material is an alloy comprising silicon and germanium.

3. A device according to claim 2 wherein, in said alloy, germanium is present in the range of 3–4% by weight.

4. A device according to claim 3 wherein the remainder of said alloy consists of silicon.

5. A device according to claim 1 wherein said control electrode is an insulated gate electrode for controlling said charge carrier flow from a source region through a channel region to a drain region, all of said regions being within said first body.

6. A device according to claim 5 wherein said source region and said drain region are of a first conductivity type and said second body is of a second conductivity type.

7. A device according to claim 6 wherein said drain region includes two portions of respectively high and low electrical conductivity, said portion of high conductivity forming said heterojunction with said second body and separating said portion of low conductivity from said heterojunction.

8. A device according to claim 1 wherein said control electrode is in direct contact with a first region of said first body forming said p-n homojunction with a second region of said first body, and a third electrode connected to said second region for, during on-state operation of said device, injecting charge carriers of said first conductivity type across said homojunction and into said first region.

9. A device according to claim 8 wherein said first region forms a p-n homojunction with a third region of said first body forming said p-n heterojunction with said second body.

10. A device according to claim 1 wherein the bandgap of said second material is less than that of said first material by an amount in the range of 0.031 eV to 0.035 eV.

11. A device according to claim 1 wherein said control electrode is one of a plurality of parallel connected control electrodes for identically controlling the flow of charge carriers of said first conductivity type from respective ones of a plurality of parallel connected areas of origination of said charge carriers to said second body through said p-n heterojunction.

12. A device according to claim 11 wherein each of said areas forms a respective one of a plurality of p-n homojunctions within said first body, and wherein, during operation of the device in a non-conducting, voltage-blocking mode, said homojunctions are reverse biased while said heterojunction is forward biased.

* * * * *